United States Patent [19]

Ahn et al.

[11] Patent Number: 4,803,110
[45] Date of Patent: Feb. 7, 1989

[54] COATED MASK FOR PHOTOLITHOGRAPHIC CONSTRUCTION OF ELECTRIC CIRCUITS

[75] Inventors: Kie Y. Ahn, Chappaqua; Saryadevara Basavaiah, Mahopac; Stephen B. Brodsky, Monsey; Charles A. Cortellino, Wappinger Falls; Joseph E. Levine, Poughkeepsie, all of N.Y.

[73] Assignee: International Business Machines Corporation, Armonk, N.Y.

[21] Appl. No.: 907,268

[22] Filed: Sep. 15, 1986

[51] Int. Cl.$^4$ .......................... B32B 3/10; B05D 3/06; G03F 9/00
[52] U.S. Cl. ............... 428/137; 204/192.26; 204/192.15; 427/35; 427/143; 427/282; 428/131; 428/134; 428/457; 428/698; 428/704; 430/5
[58] Field of Search ............... 428/698, 131, 134, 137, 428/457, 704; 204/192 R; 427/35, 191, 143, 259, 282; 430/5

[56] References Cited

U.S. PATENT DOCUMENTS

| | | | |
|---|---|---|---|
| 3,802,078 | 4/1974 | Denes | 30/350 |
| 4,006,073 | 2/1977 | Welch | 204/298 |
| 4,169,913 | 10/1979 | Kobayashi et al. | 428/698 |
| 4,260,658 | 4/1981 | Erickson | 428/698 |
| 4,406,668 | 9/1983 | Sarin et al. | 428/698 |
| 4,406,670 | 9/1983 | Sarin et al. | 428/698 |
| 4,411,960 | 10/1983 | Mizuhara | 428/698 |
| 4,420,498 | 12/1983 | Hirose et al. | 427/39 |
| 4,470,895 | 9/1984 | Coat et al. | 204/192 |
| 4,497,878 | 2/1985 | Hatano et al. | 428/698 |
| 4,522,453 | 6/1985 | Lammer et al. | 428/698 |
| 4,525,415 | 6/1985 | Porat | 428/698 |

FOREIGN PATENT DOCUMENTS 2528255 2/1976 Fed. Rep. of Germany ...... 428/698

OTHER PUBLICATIONS

Levine et al, "Inspection in the Third Dimension:Metal Mack Inspection Problems High-Performance Multilayer Ceramic Package", Spie-Integrated Circuit Metrology, vol. 342, 1982, pp. 44–52.

Primary Examiner—George F. Lesmes
Assistant Examiner—James B. Monroe
Attorney, Agent, or Firm—Perman & Green

[57] ABSTRACT

A mask for deposition of electrically-conductive paste material on a ceramic base, in the construction of electric circuits having multiple electronic chips is formed of molybdenum with a titanium nitride coating. The coating passes through apertures of a mesh on one side of the mask and continues through the apertures to appear in cutouts of stencils along the opposite side of the mask. Other elements of the fourth group of the periodic table, such as zirconium, may be employed in lieu of the titanium in the formation of the coating. The coating is uniformly applied by a sputtering procedure in which nitrogen is sprayed uniformly along the mask and away from a titanium target. In an argon plasma, the nitrogen and the titanium are sputtered onto the molybdenum where the titanium and nitrogen combine to form the coating.

11 Claims, 2 Drawing Sheets

FIG. 4.
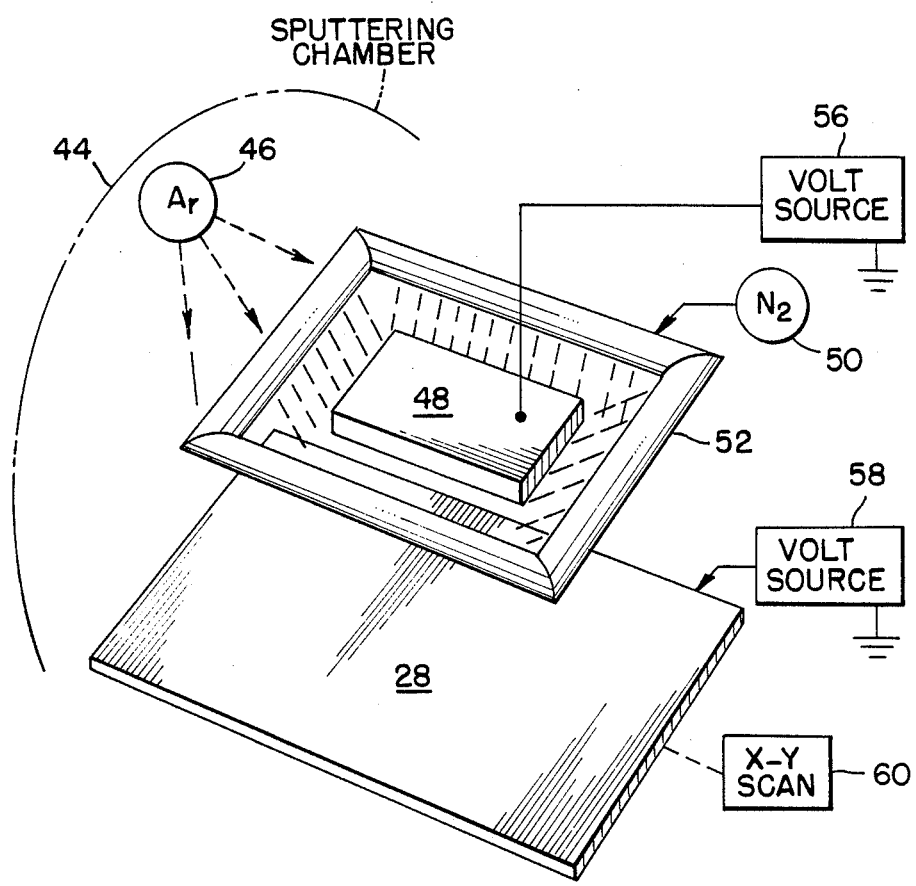
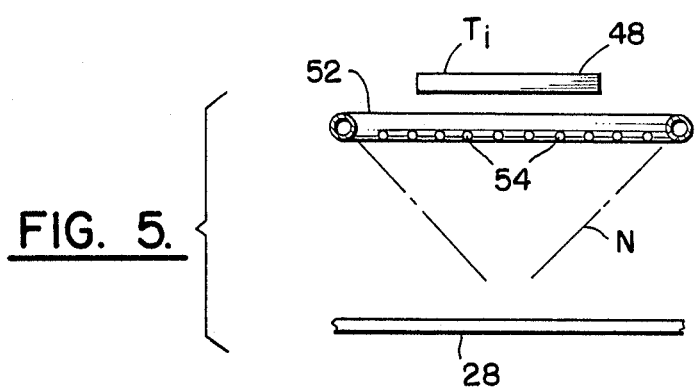
FIG. 5.

COATED MASK FOR PHOTOLITHOGRAPHIC CONSTRUCTION OF ELECTRIC CIRCUITS

BACKGROUND OF THE INVENTION

This invention relates to masks for producing metal conductive paths between elements of a semiconductive electric circuit and, more particularly, to the construction of a molybdenum mask with an abrasion resistant coating for extending useful life of the mask by inhibiting a development of scratches and other surface imperfections which introduce defects in the conductive paths.

Photolithographic procedures are employed in the construction of semiconductive electric circuits. Typically, a number of circuit modules or chips are supported on carriers which, in turn, are physically supported and electrically connected by a base such as a card or board. In one form of construction, the base is constructed of a ceramic material having electrically conductive paths of metallic material deposited thereon. The base may be fabricated as a laminate comprising a plurality of layers of ceramic material, each of which supports electrically conductive paths which allow for interconnection of terminals of the various chips supported by the base.

The conductive paths are fabricated by photolithographic techniques employing a mask through which material of the conductive paths, in a paste form, is supplied via the mask to the ceramic base in a procedure similar to a silk-screen printing process.

The printing process is done before curing of the clay of the ceramic, while the clay is still soft; thereafter, both the conductive paths of the paste material and the ceramic base are fired together to produce the rigid base with the rigid electrically-conductive paths thereon. The base, prior to the firing, sometimes is referred to as a green sheet, composed primarily of alumina with a small percentage of glass, such as 90% alumina and 10% glass. Such a formulation is compatible with the expansion and contraction characteristics of conductive paths formed of molybdenum.

The ceramic "green sheet" in the unfired condition has a nominal thickness in the range of 0.2 millimeters to 0.28 millimeters, and is a mixture of ceramic and glass powder suspended in an organic binder. The paste for forming the conductive paths may consist of, by way of example, a molybdenum powder uniformly dispersed in a resin and solvent mixture. Metallization of the green sheet is accomplished by extruding the molybdenum paste through a nozzle as the nozzle traverses the mask. The mask is in contact with the green sheet during the extrusion process. The pattern of the conductive paths is defined by the mask.

The mask is formed of metal, such as copper, molybdenum, or stainless steel in the form of a thin foil having a thickness in the range of 0.001–0.006 inch. The mask may have a square or rectangular shape ranging from 0.5 to 7 inches on a side. The masks are fabricated in a composite structure wherein, when viewed from one surface, the mask appears as a mesh or screen while, when viewed from the opposite surface, the mask appears as a stencil having elongated cut-out portions defining the shapes of the conductive paths. The surface with the stencil is placed against the ceramic base during the process of extruding the paste material through the mask upon the base.

A problem arises in that the pressing of the metallic paste through the apertures of the mask introduces a wearing of the mask due to friction between the particles of metal in the paste and the metal of the mask. In this respect, masks fabricated of pure molybdenum have been most successful in retaining dimensional stability of the mask during repeated usage of the mask so as to insure the reproduction of the fine metallic conductive paths on the ceramic base. However, even the molybdenum masks tend to fail after several hundred cycles of repeated use.

SUMMARY OF THE INVENTION

The aforementioned problem is overcome and other advantages of the invention are attained with a mask having apertures therein for the application of an extruded conductive paste to a ceramic base, the mask being provided, in accordance with the invention, with a coating imparting lubricity to metallic particles within the paste and resistance to abrasion from particulate matter of the paste.

The mask is constructed of a metal, preferably molybdenum, and incorporates a composite structure of a mesh and a stencil, the arrangement of apertures of the mesh appearing on one surface of the mask while the structure of the stencil appears on the opposite surface of the mask. Cutout regions of the stencil communicate with apertures of the mesh, the mesh serving as a screen to permit application of the conductive paste in the manner of silk screen printing. The coating of the invention is applied by sputtering in a plasma environment so as to uniformly cover both of the opposed mask surfaces including the apertures of the mesh and the cutout portions of the stencil.

In a preferred embodiment of the invention, titanium nitride is sputtered on to the bare surface of the molybdenum mask. The surface of the molybdenum is cleaned by an argon plasma in a chamber from which air has been previously evacuated.

The titanium and the nitrogen of the titanium nitride are applied from separate sources within a sputtering chamber, and, in the presence of an electric field, combine to form the compound of titanium nitride upon the surface of the molybdenum. The source of the titanium is a water-cooled titanium target. The source of the nitrogen is a set of nozzles of a manifold connected to a nitrogen tank and spraying jets of nitrogen towards the molybdenum. In accordance with well-known sputtering technology, the target and the molybdenum mask receive a voltage potential for directing charged atoms of titanium and of the argon plasma.

In accordance with a feature of the invention, the jets of nitrogen are directed away from the titanium target to prevent any buildup of titanium nitride on the target, thereby to insure a uniform emission of titanium from the target. In addition, the jets are arranged to provide a uniform distribution of nitrogen in the vicinity of the mask to insure a uniform deposition of the titanium nitride. The deposition of the titanium nitride is made thin, in the range of 2000–6000 angstroms to insure a rigid bond between the coating and the underlying molybdenum. Other elements from the fourth group of the periodic table of the elements, such as zirconium and silicon are believed to provide a coating similar to that of the titanium nitride. The plasma may be formed of argon or of another element from group VIII of the periodic table. Also contemplated by the invention is a coating of a composite refractory material of titanium, zirconium, and nitrogen.

It is noted, that in the use of a mask with a paste having metallic particles therein, an abrasion between such particle and a surface of the molybdenum may be manifested as a scratch which may ensnare particulate matter of the paste. During the curing process of the ceramic and of the paste material, wherein the ceramic and the paste material are fired at an elevated temperature, a particle of paste material caught within the scratch is also cured. During a subsequent usage of the mask, such particle may be released from the mask and appear in a thin conductive strip. This presents a nonuniformity to the strip which may result in either breakage of the strip or a shorting between neighboring conductive strips. Also, the presence of an abrasion in a sidewall of a stencil cutout can similarly distort a deposited strip of conductive material. The tight adherence of the thin coating, the lubricity thereof to such particulate matter, and the resistance to abrasion from such particulate matter inhibits the formation of the foregoing defects in the mask and prevents the formation of imperfections in the positive conductive strips.

BRIEF DESCRIPTION OF THE DRAWING

The aforementioned aspects and other features of the invention are explained in the following description, taken in connection with the accompanying drawing wherein:

FIG. 4 is a perspective view, partially stylized, of sputtering apparatus for coating the mask of FIG. 2 in accordance with the invention; and FIG. 5 is a side elevation view, partially stylized, of the apparatus of FIG. 4.

DETAILED DESCRIPTION

Figure 1:
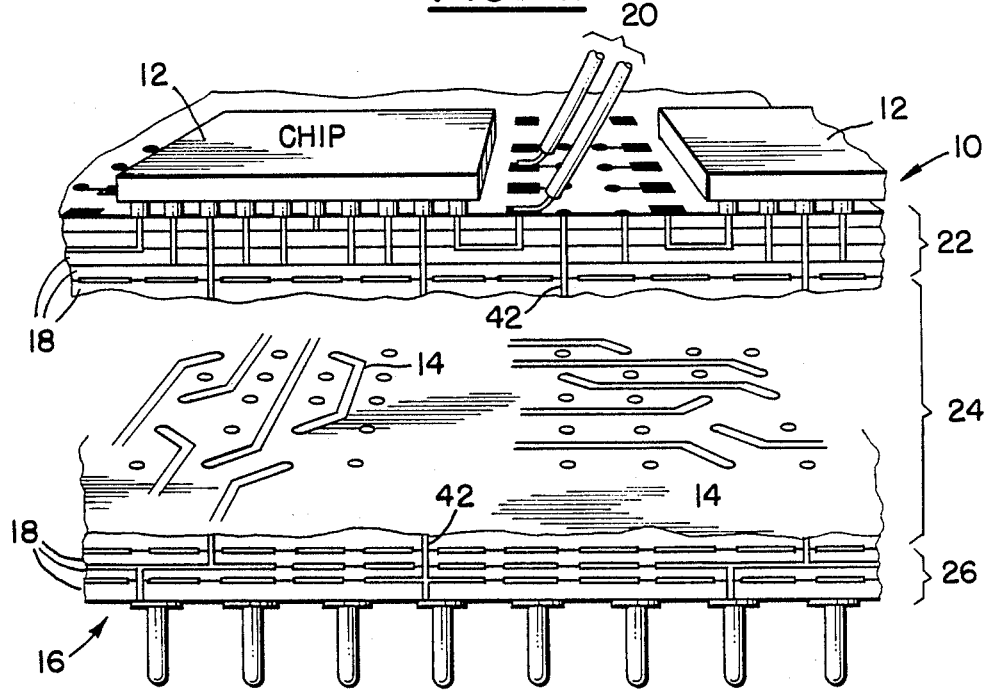
FIG. 1 shows an exploded view of a portion of a semiconductor chip circuit on a laminated base wherein individual layers of the base contain electrical conductors in the form of metallic films.

FIG. 1 shows a portion of an electric circuit constructed in the form of a multilayer multichip module 10 wherein circuit chips 12 are electrically interconnected by conducting paths 14 which may be constructed by use of the mask of the invention. The chips 12 are supported by a base 16 constructed as a laminate with individual layers 18 being formed of ceramic material, and supporting various ones of the conducting paths 14. Discrete wiring 20 on the uppermost layer permits connection with individual—ones of the chips 12. With respect to the functions of the conducting paths 14 on each of the layers 18, the uppermost group 22 of the layers may be employed as redistribution layers, the middle group 24 of the layers may be employed as signal distribution layers, and the bottom group 26 may be employed as power distribution layers.

Each of the layers 18 is individually constructed from a soft "green sheet" of unfired ceramic with the aid of the mask of the invention, the mask being employed with a well-known extrusion nozzle (not shown) which forces a conductive paste through apertures in the mask to form the electrically-conducting paths 14 on respective ones of the layers 18. Upon completion of the deposition of the conducting paste, a ceramic sheet with its deposited conducting paste is fired at elevated temperatures to cure the ceramic and the paste to provide a hard rigid structure to the layer with dimensionally stable conducting paths thereon. The process for the imprinting of the conducting paths 14 on an individual layer 18 by use of a mask is well known, and need not be explained herein in detail for an understanding of the invention. Also, the photolithographic techniques for forming the mask with a mesh, or screen, on one side thereof with a stencil format appearing on the reverse side thereof is well known and need not be described in detail for an understanding of the invention.

Figure 3:
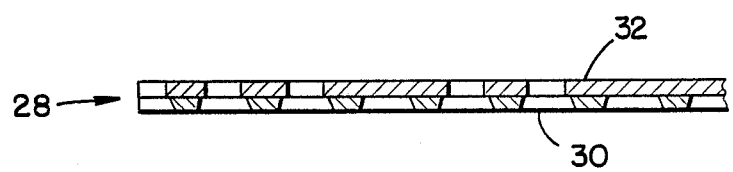
FIG. 3 is a sectional view of the mask of FIG. 2.
Figure 2:
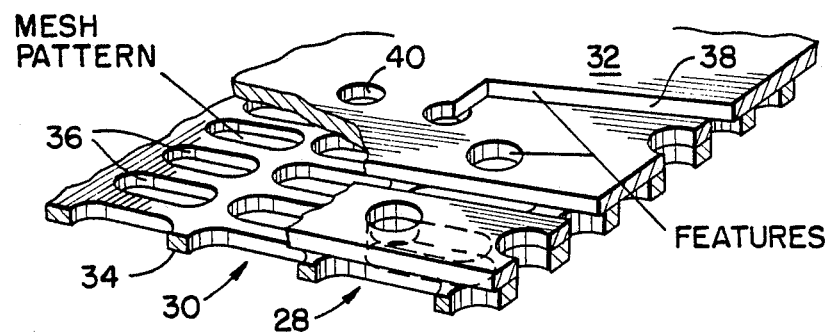
FIG. 2 shows a fragmentary view of a mask of the invention suitable for depositing the metallic film conductors in the structure of FIG. 1.

In FIG. 2, there is shown a fragmentary view of a mask 28 which is constructed in accordance with the invention and includes a mesh layer 30 contiguous to a stencil layer 32. With reference also to a sectional view of the mask 28 presented in FIG. 3, the mesh layer 30 is formed as a supporting frame 34 with an array of apertures 36 therein to perform the function of screening paste material extruded through the mask 28. In FIG. 2, a portion of the stencil layer 32 is cut away to show the array of apertures 36 in the mesh layer 30. The stencil layer 32 includes cutout portions formed in accordance with the features which are to be formed as the electrically conducting foil of the paths 14 in FIG. 1. These features include elongated cutouts 38 to form a conducting path, and circular cutouts 40 for establishing electrical connections with vias 42 of FIG. 1 by which signals are routed between layers 18.

Both of the layers 30 and 32 are constructed of a metal, such as copper, stainless steel, or molybdenum.

In the case of copper, a nickel coating is employed for improved resistance to chemical interaction between the mask and the material of the paste. The nickel offers no significant resistance to abrasion and, hence, no increase in longevity to the usage of the mask. Molybdenum is employed in the preferred embodiment of the invention because of improved dimensional stability and resistance to abrasion of the paste material as composite of the nickel clad copper or the stainless steel. The paste, which is well known, is composed of molybdenum powder dispersed in resin and a solvent.

However, even with the construction of the mask 28 from pure molybdenum, the longevity of the mask is limited to several hundred operations, possibly as many as 700 operations, of the imprinting of the conducting paths 14 on the layers 18 of FIG. 1. By virtue of the construction of the mask 28 in accordance with the invention by placing a dimensionally stable and abrasion-resistant coating on the molybdenum, the longevity to the mask is increased by an order of magnitude so that many more printing operations can be accomplished with the mask 28 than has been possible heretofore.

FIGS. 4 and 5 show a step in the construction of the mask wherein a coating is applied to all surfaces of the mask 28 which may come in contact with the paste material, this including the outer surfaces of the mesh layer 30 and the stencil layer 32, as well as the apertures 36 in the cutouts 38 and 40. The apparatus of FIGS. 4 and 5 will be demonstrated for the case of a titanium nitride coating, it being understood that the apparatus may also be employed for other coatings such as zirconium nitride.

The coating is applied by a sputtering process in a chamber 44, partially indicated in phantom. The chamber 44 is evacuated of air and filled with argon, a source 46 of argon being indicated diagrammatically in FIG. 4.

A titanium nitride coating, in the form of a thin film having a thickness in the range of 2000-6000 angstroms is to be deposited by reactive sputtering in an environment of a plasma of charged argon atoms.

The titanium is provided by a titanium target 48 located above the mask 28. Nitrogen from a source 50 is administered via a manifold 52 which encircles the target 48 and is positioned coaxially thereto. Both the manifold 52 and the target 48 are provided with a rectangular or square shape. The manifold 52 is composed of four hollow arms having apertures 54 which serves as nozzles for spraying jets of nitrogen gas in a direction of approximately 45 degrees relative to the plane of the target 48 so as to uniformly distribute the nitrogen in the space immediately above the mask 28. The 45 degree inclination of the jets of nitrogen insure that the jets of nitrogen from the apertures 54 clear the target 48 so as to avoid any interaction between the nitrogen and the titanium of the target 48 at the surface of the target 48.

The target 48 and the mask 28 are charged with voltage from voltage sources 56 and 58 in accordance with standard sputtering technology. The mask 28 is held within a scanning device 60 which moves the mask 28 both in the X direction and in the Y direction, parallel to the plane of the target 48, to uniformly deposit atoms of titanium and atoms of nitrogen on the surface of the mask 28.

In the case of sputtering of titanium or zirconium, DC magnetron sputtering is employed. In the case of the sputtering of silicon, RF (radio frequency) sputtering is employed. A conventional, commercially available sputtering chamber is employed. The argon is applied at a pressure of 10 millitorr in the chamber 44. The manifold 52 is fabricated of stainless steel. The apertures 54 in the manifold 52 may be made of differing sizes, such that the apertures near the corners of the manifold 52 are larger to compensate for the greater distance of the apertures from the center of the target 48 by emitting larger quantities of nitrogen. This insures greater uniformity to the distribution of the nitrogen. A typical value of voltage applied by the source 56 to the titanium target 48 is +400 v. A typical value of voltage applied by the source 58 to the molybdenum mask 28 is −150 v.

In the presence of the plasma and the electric fields set up by the voltage sources 56 and 58, positive titanium atoms and nitrogen atoms interact to form the compound titanium nitride at the surface of the mask 28, the negative potential of the mask 28 discharging the positive titanium ions. The titanium nitride coating has a resistivity of 40 microohm-centimeter.

The stochiometry of the titanium nitride is preferably 1:1 for the titanium and the nitrogen atoms, which ration can be varied by altering the nitrogen partial pressure. The 1:1 ratio is attained with a partial pressure of nitrogen of 6% and a partial pressure of argon of 94%. The partial pressure of the nitrogen can be measured by use of a residual gas analyzer (not shown) attached to the chamber 44 to sense the concentration of the nitrogen. In response to the measured concentration by the gas analyzer, the partial pressure of the nitrogen can be controlled by conventional methods of regulating the flow of nitrogen from the source 50.

It is noted, by way of alternative methods of constructing the coating, that a coating of silicon nitride can be produced by chemical vapor deposition (CVD). Such a process involves the use of silane and nitrogen which interact to produce silicon nitride and hydrogen. The silicon nitride precipitates on the mask as a thin coating under condition wherein the mask temperature is in the range or 500-600 degrees centigrade.

The success of the titanium nitride in increasing the longevity of the mask in the preferred embodiment of the invention is believed to be due to its very high resistance to abrasion. For example, titanium nitride has been employed in the coating of drill bits which drill through rock. The coating by sputtering insures that the titanium nitride molecules adhere tightly to the molybdenum. The molybdenum is dimensionally stable and, accordingly, the thin film of the titanium nitride retains the dimensional stability while presenting the abrasion resistant surface to the paste which is to be extruded through the mask. It is believed that other hard substances, such as silicon carbide, may also be deposited as a thin coating upon a dimensionally stable metal to produce a mask with increased longevity in accordance with the invention.

It is to be understood that the foregoing embodiment of the invention is illustrative only, and that modifications thereof may occur to those skilled in the art. Accordingly, this invention is not to be regarded as limited to the embodiment disclosed herein, but is to be limited only as defined by the appended claims.

Having thus described our invention, what we claim as new, and desire to secure by Letters Patent is:

1. A mask for deposition of paste material in a predetermined format comprising:
    a metallic substrate in the form of a thin foil having a thickness in the range of 0.001-0.006 inch;
    a mesh formed in said metallic substrate and extending inwardly from a first exterior surface of the substrate;
    a stencil formed in said metallic substrate and extending inwardly from a second exterior surface of said substrate opposite said first exterior surface, there being perforations in said mesh and in said stencil, perforations in said stencil communicating with predetermined ones of the perforations in said mesh for passage of paste material therethrough; and
    a coating of a compound of nitrogen and an element of the fourth group of elements of the periodic table, said coating having a thickness of 2000-6000 angstroms; said coating being uniformly deposited on said substrate to provide lubricity and resistance to abrasion of said paste material within said mesh and within said stencil.

2. A mask for deposition of paste material in a predetermined format comprising:
    a metallic substrate in the form of a thin foil having a thickness in the range of 0.001-0.006 inch;
    a mesh formed in said metallic substrate and extending inwardly from a first exterior surface of the substrate;
    a stencil formed in said metallic substrate and extending inwardly from a second exterior surface of said substrate opposite said first exterior surface, there being perforations in said mesh and in said stencil, perforations in said stencil communicating with predetermined ones of the perforations in said mesh for passage of paste material therethrough; and
    a coating of a compound of nitrogen and an element of the fourth group of elements of the periodic table; said coating being uniformly deposited on said substrate to provide lubricity and resistance to abrasion of said paste material within said mesh and within said stencil; and wherein said substrate is formed of molybdenum, and said coating has a depth of 2000–6000 angstroms.

3. A mask for deposition of paste material in a predetermined format comprising:
   a metallic substrate in the form of a thin foil having a thickness in the range of 0.001–0.006 inch;
   a mesh formed in said metallic substrate and extending inwardly from a first exterior surface of the substrate;
   a stencil formed in said metallic substrate and extending inwardly from a second exterior surface of said substrate opposite said first exterior surface, there being perforations in said mesh and in said stencil, perforations in said stencil communicating with predetermined ones of the perforations in said mesh for passage of paste material therethrough; and
   a coating of a compound of nitrogen and an element of the fourth group of elements of the periodic table, said coating having a thickness of 2000–6000 angstroms, said coating being uniformly deposited on said substrate to provide lubricity and resistance to abrasion of said paste material within said mesh and within said stencil; and wherein
   said compound is formed of nitrogen and at least one element of the fourth group of the periodic table consisting of titanium, zirconium, and silicon.

4. A mask according to claim 3 wherein said coating is formed of nitrogen and titanium.

5. A mask according to claim 3 wherein said coating is formed of nitrogen and zirconium.

6. A mask according to claim 3 wherein said coating is formed of nitrogen and silicon.

7. A mask for deposition of electrically-conductive paste material on a base in the construction of an electric circuit, the mask being in the form of a thin foil having a thickness in the range of 0.001–0.006 inch and having apertures extending therethrough from a first surface to a second surface of the mask to define the shapes of regions of the paste material to be deposited on the base, said apertures defining a mesh opening toward a first exterior surface of the mask and a stencil opening towards a second exterior surface of the mask opposite said first exterior surface, the mask further comprising:
   a coating of a compound of nitrogen and an element of the fourth group of elements in the periodic table, said coating having a thickness of 2000–6000 angstroms and being uniformly deposited within said apertures and on said first surface and on said second surface to provide lubricity and resistance to abrasion of said paste material upon said mask.

8. A mask for deposition of electrically-conductive paste material on a base in the construction of an electric circuit, the mask being in the form of a thin foil having a thickness in the range of 0.001–0.006 inch and having apertures extending therethrough from a first surface to a second surface of the mask to define the shapes of regions of the paste material to be deposited on the base, the mask further comprising:
   a coating of a compound of nitrogen and an element of the fourth group of elements in the periodic table, said coating having a thickness of 2000–6000 angstroms and being uniformly deposited within said apertures and on said first surface and on said second surface to provide lubricity and resistance to abrasion of said paste material upon said mask; and wherein
   said compound is formed of nitrogen and one of the elements of the fourth group of the periodic table consisting of titanium, zirconium and silicon.

9. A mask according to claim 8 wherein said coating is formed of a compound of nitrogen and titanium.

10. A method of coating a mask used in the construction of modular electric circuits by imprinting conductive paths on a base material, the method comprising the steps of:
    constructing a mask substrate of a dimensionally stable material, the mask substrate being in the form of a thin foil having a thickness in the range of 0.001–0.006 inch and having apertures extending inwardly from a first surface to define a screen pattern and extending inwardly from a second surface to define a stencil pattern;
    placing said mask substrate in front of and away from a source of a group IV element of the periodic table;
    sputtering the group IV element of the periodic table onto the mask substrate;
    simultaneously discharging nitrogen into a region of space permeated by the said sputtered element to provide a coating of nitrogen and said sputtered element upon the dimensionally stable material of said substrate;
    directing the nitrogen away from said source, thereby to prevent contamination of the source and to preserve a uniform distribution of sputtering of the group IV element upon said mask substrate; and
    terminating said sputtering upon attainment of a depth of said coating in the range of 2000–6000 angstroms, thereby providing a mask surface which is resistant to abrasion.

11. A method of coating a mask used in the construction of modular electric circuits by imprinting conductive paths on a base material, the method comprising the steps of:
    constructing a mask substrate of a dimensionally stable material, the mask substrate being in the form of a thin foil having a thickness in the range of 0.001–0.006 inch and having apertures extending inwardly from a first surface to define a screen pattern and extending inwardly from a second surface to define a stencil pattern;
    placing said mask substrate in front of and away from a source of a group IV element of the periodic table;
    sputtering the group IV element of the periodic table onto the mask substrate;
    simultaneously discharging nitrogen into a region of space permeated by the said sputtered element to provide a coating of nitrogen and said sputtered element upon the dimensionally stable material of said substrate;
    directing the nitrogen away from said source, thereby to prevent contamination of the source and to preserve a uniform distribution of sputtering of the group IV element upon said mask substrate; and
    terminating said sputtering upon attainment of a depth of said coating in the range of 2000–6000 angstroms, thereby providing a mask surface which is resistant to abrasion, and wherein
    the substrate of said mask is fabricated of molybdenum, and said sputtered element is an element of the fourth group of the periodic table consisting of titanium and zirconium.

* * * * *